United States Patent
Soeta

Patent Number: 5,851,287
Date of Patent: Dec. 22, 1998

[54] SEED CRYSTAL HOLDER

[75] Inventor: Satoshi Soeta, Takefu, Japan

[73] Assignee: Shin-Etsu Handotai Co., Ltd., Tokyo, Japan

[21] Appl. No.: 804,146

[22] Filed: Feb. 20, 1997

[30] Foreign Application Priority Data

Mar. 1, 1996 [JP] Japan ................................. 8-071189

[51] Int. Cl.$^6$ .................................................. C30B 35/00
[52] U.S. Cl. ........................ 117/208; 117/200; 117/218; 117/900
[58] Field of Search ..................... 117/200, 208, 117/218, 900, 911

[56] References Cited

U.S. PATENT DOCUMENTS

| | | | |
|---|---|---|---|
| 3,046,029 | 7/1962 | Weber et al. | 279/37 |
| 3,159,408 | 12/1964 | Sanchez et al. | 117/911 |
| 3,592,937 | 7/1971 | Emeis | 117/911 |
| 4,186,173 | 1/1980 | Jericho et al. | 117/911 |
| 4,594,127 | 6/1986 | Lane et al. | 117/911 |

FOREIGN PATENT DOCUMENTS

| | | | |
|---|---|---|---|
| 000135274A | 4/1979 | Germany | 117/911 |
| 56-37294 | 4/1981 | Japan . | |
| 62-362212291A | 9/1987 | Japan | 117/911 |
| 1381417 | 1/1975 | United Kingdom . | |

*Primary Examiner*—Felisa Garrett
*Attorney, Agent, or Firm*—Oliff & Berridge, PLC

[57] ABSTRACT

A seed crystal holder is used to grow a single crystal in an intended direction. In order to grow a single crystal in an intended direction by a crystal pulling method, a seed crystal is accurately cut out along a crystal orientation, and this seed crystal is accurately held in a predetermined attitude by the seed crystal holder. A seed crystal insertion bore having a rectangular cross-section is formed in the body of the seed crystal holder. A seed crystal having a taper surface at one edge is inserted into the seed crystal insertion bore. The inserted seed crystal is pressed at its taper surface by a taper surface of a block, so that two surfaces of the seed crystal are fixedly pressed against two inner surfaces of the seed crystal insertion bore. The other end of the block is covered with a block-retaining ring, so that the block does not come off the seed crystal holder.

17 Claims, 6 Drawing Sheets

FIG. 1
FIG. 2
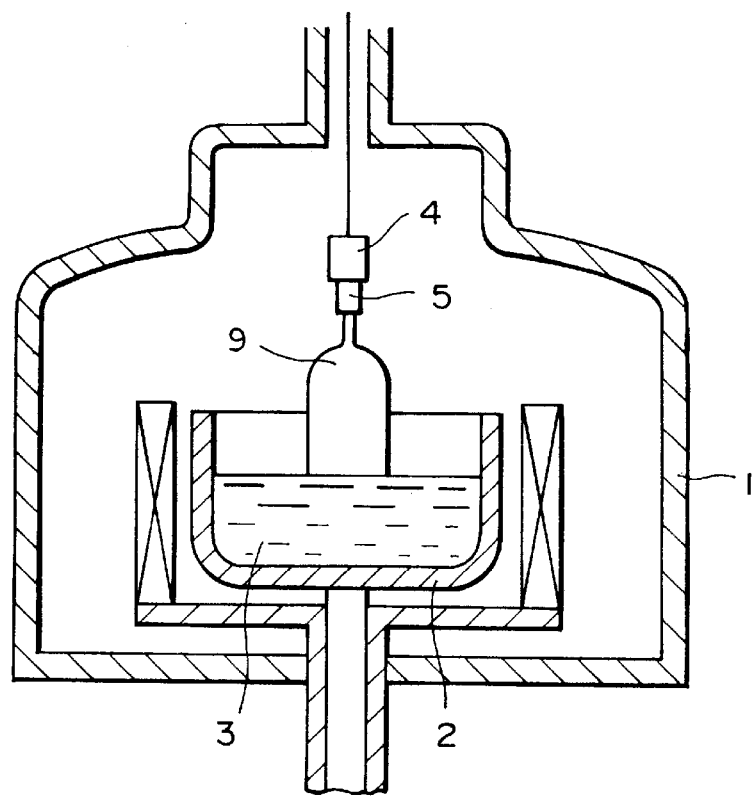
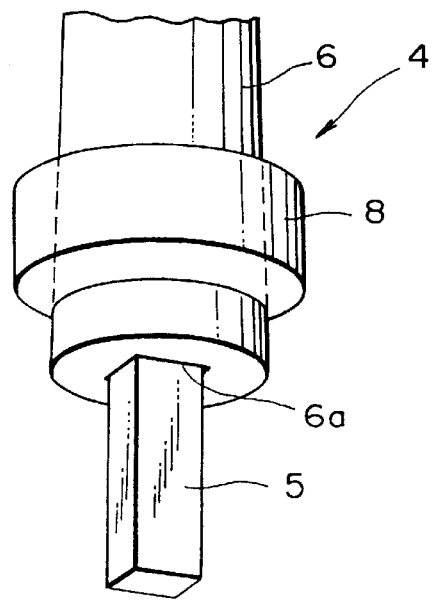

(DISTRIBUTION OF CRYSTAL GROWTH DIRECTIONS)

(DISTRIBUTION OF CRYSTAL GROWTH DIRECTIONS)

SEED CRYSTAL HOLDER

BACKGROUND OF THE INVENTION

1. Field of the Invention

The present invention relates to an improvement on a seed crystal holder used in manufacture of a single crystal in accordance with, for example, the pulling method.

2. Description of the Related Art

Conventionally, there has been known the pulling method called the Czochralski method wherein a seed crystal is dipped in a melt of a polycrystalline material and subsequently pulled to thereby obtain a single crystal. In this method, a seed crystal held by a seed crystal holder is dipped in the melt, and the seed crystal holder is then pulled upwardly by pulling means so as to grow a single crystal below the seed crystal.

Regarding a seed crystal holder, there has been known, for example, a seed crystal holder 50 as shown in FIGS. 7 and 8. In the prior art seed crystal holder 50, a seed crystal 52 is inserted into a seed crystal insertion bore 51a of a holder body 51, and the inserted seed crystal 52 is pressed and held by a block 53. A block-retaining ring 54 is fit onto the holder body 51 such that the block-retaining ring 54 corresponds to the end portion of the block 53. As a result, the block 53 is prevented from coming off the holder body 51. The outer surface of the holder body 51 is tapered such that the diameter of the holder 51 increases toward the downward direction. The inner diameter of the block-retaining ring 54 is identical to the outer diameter of the holder body 51 at the position of the block 53. Thus, the block-retaining ring 54 can freely move in a vertical direction in a region above the position of the block 53.

In order to prevent the seed crystal 52 from slipping off a retained position, taper surfaces 53t and 52t are formed on the block 53 and the seed crystal 52, respectively, such that these taper surfaces 53t and 52t engage with each other.

When a single crystal is grown by the pulling method, in order to grow a single crystal in a certain crystal orientation so as to obtain a single crystal having a crystallographically good atom configuration, a seed crystal must be accurately cut out along an intended crystal orientation, and the thus-prepared seed crystal must be accurately held in a required attitude by a seed crystal holder. However, as shown in FIG. 9, the above-described conventional technique has a problem that the seed crystal 52 tends to slightly tilt about a line along which pressing force is applied to the seed crystal. Therefore, the seed crystal 52 cannot be fixed to the holder 51 in a true vertical orientation.

As a result, for example, as shown in FIG. 10, a direction B along which a single crystal actually grows deviates from an intended direction A.

Accordingly, there has been eager demand for a seed crystal holder capable of accurately holding a seed crystal in an intended direction.

SUMMARY OF THE INVENTION

The present invention has been accomplished to solve the above-mentioned problem, and it is an object of the present invention to provide a seed crystal holder which can accurately hold a seed crystal in an intended direction.

To achieve the above object, the present invention provides an improved seed crystal holder used to grow a single crystal by the pulling method. The seed crystal holder has a seed crystal insertion bore into which a seed crystal is inserted, as well as pressing means for pressing an inserted seed crystal against an inner surface of the seed crystal insertion bore, wherein the seed crystal insertion bore has a rectangular cross-section, and the pressing means applies pressing force to the seed crystal toward at least two inner surfaces of the seed crystal insertion bore so as to hold the seed crystal.

As a result of the pressing means pressing the seed crystal against at least two inner surfaces of the seed crystal insertion bore, the seed crystal is not held in a tilted attitude and is accurately held in an intended direction, thereby preventing the direction of growth of a single crystal from deviating from a crystal orientation of the seed crystal.

No limitations are imposed on the pressing means for pressing the seed crystal against at least two inner surfaces of the seed crystal insertion bore, and a plurality of pressing members may be used to press the seed crystal in a plurality of directions.

Preferably, the pressing means comprises a single pressing member capable of pressing the seed crystal in at least two directions simultaneously.

In this case, the pressing member presses a seed crystal in a tilted direction such that the pressing force acts on the seed crystal in two directions. For example, when the seed crystal has a rectangular cross-section, the seed crystal is pressed at a corner edge toward the center.

As a result, the structure of the seed crystal holder and operation for fixing the seed crystal to the holder can be simplified.

Preferably, the pressing surface of the pressing member and the pressure reception surface of the seed crystal are tapered in a vertical direction at a predetermined orientation.

As a result of employment of the thus-tapered surfaces, the seed crystal does not slip off the seed crystal holder, to thereby strengthen the force of holding a single crystal. Thus, it becomes possible to grow a heavier or larger single crystal.

Preferably, metal, high-purity ceramics, and graphite are used singly or in combination as a material for the seed crystal holder. Through use of these materials, the force of holding the seed crystal can be increased, and the durability of the seed crystal holder can be improved.

Since the material melt has a high temperature, components of the seed crystal holder are preferably made of a heat-resistant material.

BRIEF DESCRIPTION OF THE DRAWINGS

FIG. 1 is a schematic view of a crystal pulling apparatus;

FIG. 2 is a perspective view of a seed crystal holder according to an embodiment of the present invention;

DESCRIPTION OF THE PREFERRED EMBODIMENTS

Figure 3:
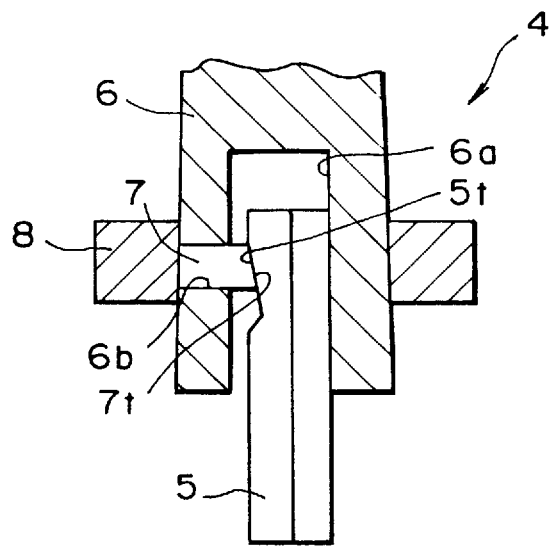
FIG. 3 is a vertical sectional view of the seed crystal holder.

Embodiments of the present invention will next be described in detail with reference to the drawings.

A seed crystal holder of the present invention is used in a crystal pulling apparatus as shown in FIG. 1. In this crystal pulling apparatus, a material melt 3 is contained in a crucible 2 which is accommodated within a chamber 1. A seed crystal 5 held by a seed crystal holder 4 of the present invention is brought in contact with the material melt 3, and subsequently the seed crystal 5 is pulled upwardly to thereby grow a single crystal 9.

Figure 4:
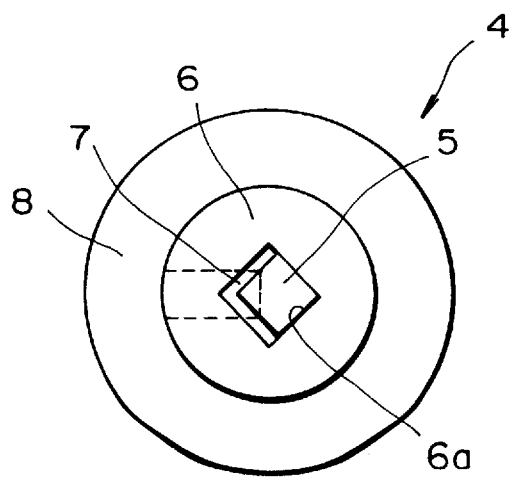
FIG. 4 is a bottom view of the seed crystal holder.

As shown in FIGS. 2 to 4, the seed crystal holder 4 includes a holder body 6 having a seed crystal insertion bore 6a, a block 7 for fixing the seed crystal 5 within the seed crystal insertion bore 6a, and a block-retaining ring 8 for preventing the block 7 from coming off the holder body 6, whereby the seed crystal 5 is fixed within the seed crystal insertion bore 6a while maintaining a predetermined crystal orientation.

The holder body 6 has its outer surface tapered in a vertical direction such that its diameter reduces toward the upward direction. The seed crystal insertion bore 6a having a rectangular cross-section is formed in the holder body 6 on the bottom end side. A through hole 6b is formed in the holder body 6 at a predetermined height above its bottom end so as to extend from its outer surface to the seed crystal insertion bore 6a. This through hole 6b is directed toward one corner edge of the seed crystal insertion bore 6a having a rectangular cross-section.

The block 7 is a pressing member capable of being inserted into the through hole 6b and has its tip formed into a pressing surface for pressing the seed crystal 5. The pressing surface is tapered such that its lower end projects beyond its upper end toward the interior of the seed crystal insertion bore 6a, thereby forming a taper surface 7t.

The block-retaining ring 8 is adapted to be fit onto the holder body 6 from above. The inner diameter of the block-retaining ring 8 is identical to an outer diameter of the holder body 6 at the position of the through hole 6b. Accordingly, this block-retaining ring 8 can freely move in the vertical direction in a region above the position of the through hole 6b, closely fits onto the circumference of the holder body 6 at the position of the through hole 6b, and cannot move downward below the position of the through hole 6b.

The above-described holder body 6, the block 7, and the block-retaining ring 8 are made of heat resistant metal, high-purity ceramics, or graphite, or a combination thereof. Through use of such material, the seed crystal 5 can be held by a strong holding force, and these components have excellent durability to heat or stress.

Next, the seed crystal 5 will be described.

As shown in FIGS. 3 and 4, the seed crystal 5 has a rectangular cross-section, and part of one corner edge of the seed crystal 5 is cut to form a pressure reception surface. The pressure reception surface is a taper surface 5t tapered in a vertical direction. When the seed crystal 5 is pressed at its pressure reception surface toward the center, two surfaces of the seed crystal 5 are pressed against two inner surfaces of the seed crystal insertion bore 6a, as shown in FIG. 4

The taper surface 5t is tapered such that its lower end projects beyond its upper end toward the interior of the seed crystal 5, so as to fit the taper surface 7t of the block 7.

Thus, when the taper surface 7t of the block 7 is pressed against the taper surface 5t of the seed crystal 5, they fit closely to thereby prevent the seed crystal 5 from slipping off downward.

The seed crystal 5 is attached to the seed crystal holder 4 in the following manner. While the block-retaining ring 8 is shifted above the through hole 6b, the seed crystal 5 is inserted into the seed crystal insertion bore 6a, and the block 7 is inserted into the through hole 6b. Subsequently, the taper surface 7t of the block 7 is closely fit onto the taper surface 5t of the seed crystal 5, and the block-retaining ring 8 is shifted downward to the position of the block 7 so as to cover the outer end of the block 7, to thereby prevent the block 7 from coming off.

As a result, the block 7 presses the seed crystal 5 at its corner edge portion toward its center to thereby simultaneously press two surfaces of the seed crystal 5 against two inner surfaces of the seed crystal insertion bore 6a. This prevents the seed crystal 5 from inclining in every direction.

Figure 5:
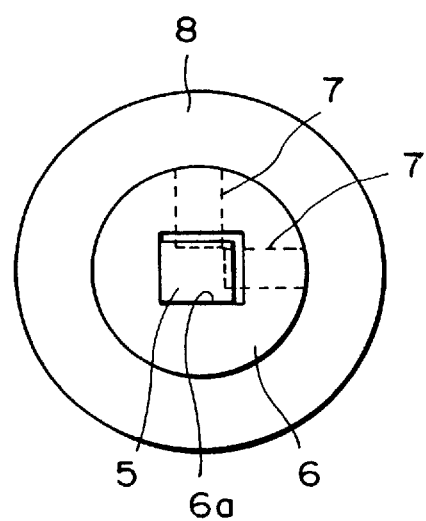
FIG. 5 is a bottom view of a seed crystal holder according to another embodiment of the present invention.

In order to press two surfaces of the seed crystal 5 against two inner surfaces of the seed crystal insertion bore 6a, for example, as shown in FIG. 5, two surfaces of the seed crystal 5 may be simultaneously pressed in perpendicularly intersecting directions by two blocks 7.

This structure is disadvantageously somewhat complex as compared with the above-described structure, but effectively prevents the seed crystal 5 from inclining.

Figure 6A:
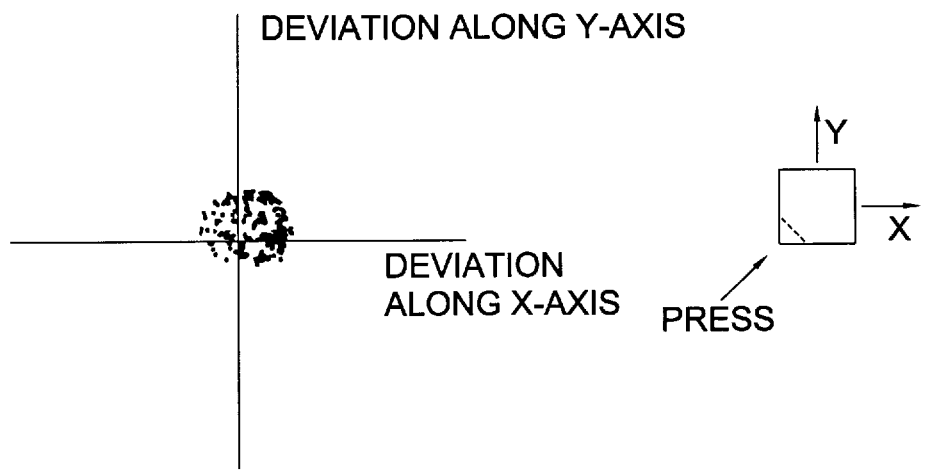
FIG. 6A is a graph showing the distribution of crystal growth directions in the case of using a seed crystal holder of the present invention.
Figure 6B:
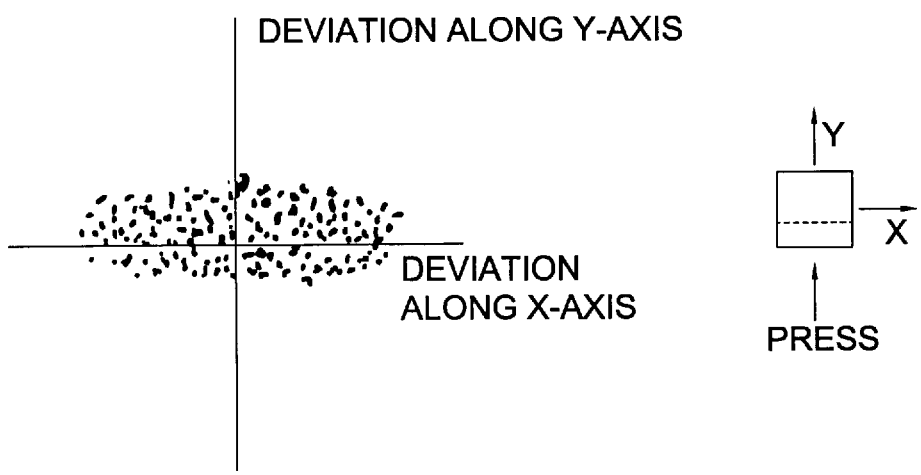
FIG. 6B is a graph showing the distribution of crystal growth directions in the case of using a conventional seed crystal holder.
Figure 7:
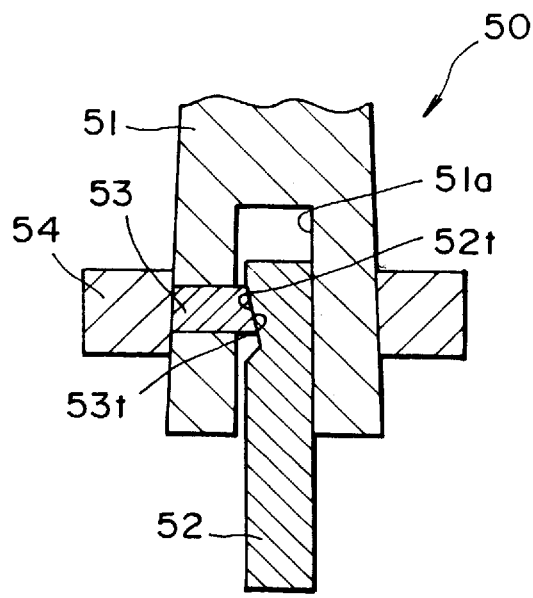
FIG. 7 is a vertical sectional view of a conventional prior art seed crystal holder.
Figure 8:
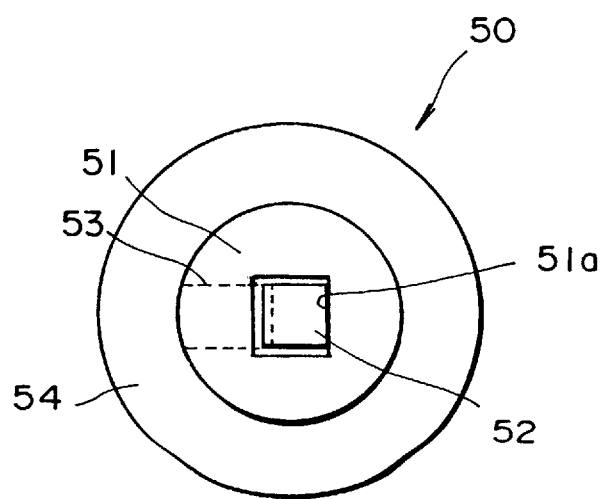
FIG. 8 is a bottom view of the conventional seed crystal holder.
Figure 9:
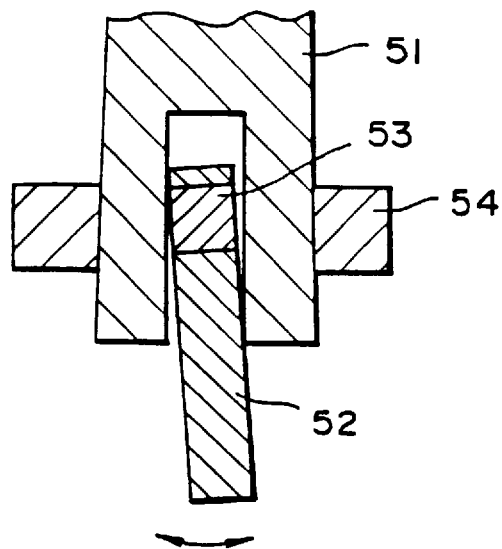
FIG. 9 (prior art) is a vertical sectional view of the conventional seed crystal holder as viewed from a direction perpendicular to the section of FIG. 7.
Figure 10:
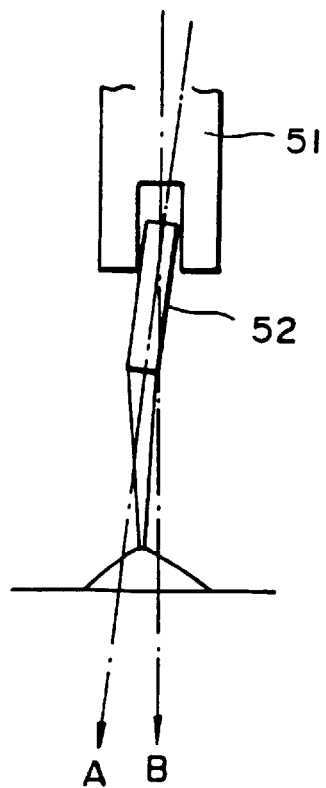
FIG. 10 (prior art) is an explanatory diagram for illustrating a deviation of a crystal growth direction from an intended crystal orientation in the case of using the conventional seed crystal holder.

FIGS. 6A and 6B compare the distribution of crystal growth directions between the present invention and a conventional technique. FIG. 6A shows the case of using the seed crystal holder 4 of the present invention. FIG. 6B shows the case of using a conventional seed crystal holder 50 (FIGS. 7 and 8). As shown in FIG. 6B, when the conventional seed crystal holder 50 is used, since a seed crystal is only pressed, for example, along the Y-axis, the dispersion of crystal growth directions along the X-axis becomes wide. By contrast, as shown in FIG. 6A, when the seed crystal holder 4 of the present invention is used, since a seed crystal is pressed along both the X-axis and the Y-axis, the dispersion of crystal growth directions becomes very narrow along both axes.

The present invention is not limited to the above-described embodiments. The above-described embodiments are mere examples, and those having the substantially same structure as that described in the appended claims and providing the similar action and effects are included in the scope of the present invention.

What is claimed is:

1. A seed crystal holder used to grow a single crystal by a pulling method, comprising:

a holder body with a seed crystal insertion bore having a rectangular cross-section into which a seed crystal is inserted; and pressing means for pressing said seed crystal toward at least two inner surfaces of said seed crystal insertion bore so as to hold said seed crystal.

2. A seed crystal holder according to claim 1, wherein said pressing means comprises a single pressing member capable of pressing said seed crystal in at least two directions simultaneously.

3. A seed crystal holder according to claim 2, wherein a pressing surface of said pressing member and a pressure reception surface of said seed crystal are tapered in a vertical direction.

4. A seed crystal holder according to claim 1, wherein components of said seed crystal holder are made of a material selected from the group consisting of heat resistant metal, high-purity ceramics and graphite, and combinations of these materials.

5. A seed crystal holder used to grow a single crystal by a pulling method, comprising:

a holder body including a seed crystal insertion bore having at least two inner surfaces and a hole through the holder body in communication with the seed crystal insertion bore, the seed crystal insertion bore receiving a seed crystal including a pressure reception surface and at least two outer surfaces; and a block for inserting through the hole and into the seed crystal insertion bore, the block including a pressing surface for pressing against the pressure reception surface of the seed crystal so as to press the at least two outer surfaces of the seed crystal simultaneously against the at least two inner surfaces of the seed crystal insertion bore so as fix the seed crystal within the seed crystal insertion bore and prevent the seed crystal from inclining.

6. A seed crystal holder according to claim 5, wherein the pressing surface of the block presses the seed crystal in at least two directions simultaneously.

7. A seed crystal holder according to claim 5, wherein the pressing surface of the block and the pressure reception surface of the seed crystal are each tapered such that the pressing surface fits the pressure reception surface so as to prevent the seed crystal from slipping in a downward direction.

8. A seed crystal holder according to claim 5, wherein the seed crystal insertion bore has a rectangular cross-section, and the hole is directed toward a corner edge of the seed crystal insertion bore.

9. A seed crystal holder according to claim 8, wherein the seed crystal has a rectangular cross-section and includes a corner edge at which the pressure reception surface is formed and a center, the pressing surface presses against the pressure reception surface toward the center so as to press the at least two outer surfaces of the seed crystal simultaneously against the at least two inner surfaces of the seed crystal insertion bore.

10. A seed crystal holder according to claim 5, further comprising a block retaining ring disposed on the holder body to prevent the block from coming off the holder body.

11. A seed crystal holder used to grow a single crystal by a pulling method, comprising:

a holder body including a rectangular shaped seed crystal insertion bore and at least one hole through the holder body in communication with the seed crystal insertion bore, the seed crystal insertion bore having at least two inner surfaces and receiving a seed crystal including at least two outer surfaces; and at least one block, the at least one block pressing against the seed crystal in at least two directions simultaneously so as to press the at least two outer surfaces of the seed crystal simultaneously against the at least two inner surfaces of the seed crystal insertion bore so as fix the seed crystal within the seed crystal insertion bore.

12. A seed crystal holder according to claim 11, wherein each block includes a pressing surface and the seed crystal includes a pressure reception surface, each of the pressing surface and the pressure reception surface being tapered such that the pressing surface fits the pressure reception surface so as to prevent the seed crystal from slipping in a downward direction.

13. A seed crystal holder according to claim 12, wherein the seed crystal has a rectangular cross-section and includes a center and a corner edge at which the pressure reception surface is formed, the pressing surface presses against the pressure reception surface toward the center so as to press the at least two outer surfaces of the seed crystal simultaneously against the at least two inner surfaces of the seed crystal insertion bore.

14. A seed crystal holder according to claim 11, wherein the seed crystal insertion bore has a rectangular cross-section, and the at least one hole is directed toward a corner edge of the seed crystal insertion bore.

15. A seed crystal holder according to claim 11, further comprising a block retaining ring disposed on the holder body to prevent the block from coming off the holder body.

16. A seed crystal holder according to claim 11, further comprising two blocks, wherein the seed crystal including two pressure reception surfaces, each of the two blocks being inserted through a hole and into the seed crystal insertion bore such that each block presses against one of the pressure reception surfaces of the seed crystal so as to press the at least two outer surfaces of the seed crystal simultaneously against the at least two inner surfaces of the seed crystal insertion bore and to fix the seed crystal within the seed crystal insertion bore.

17. A seed crystal holder according to claim 16, wherein the two blocks press on the pressure reception surfaces of the seed crystal in perpendicularly intersecting directions.

* * * * *